(12) United States Patent
Alvarez-Hérault et al.

(10) Patent No.: US 9,396,782 B2
(45) Date of Patent: Jul. 19, 2016

(54) METHOD FOR WRITING TO A RANDOM ACCESS MEMORY (MRAM) CELL WITH IMPROVED MRAM CELL LIFESPAN

(71) Applicant: CROCUS Technology SA, Grenoble Cedex (FR)

(72) Inventors: Jérémy Alvarez-Hérault, Grenoble (FR); Ioan Lucian Prejbeanu, Seyssinet Pariset (FR); Ricardo Sousa, Grenoble (FR)

(73) Assignee: CROCUS TECHNOLOGY SA, Grenoble (FR)

( * ) Notice: Subject to any disclaimer, the term of this patent is extended or adjusted under 35 U.S.C. 154(b) by 0 days.

(21) Appl. No.: 14/405,909

(22) PCT Filed: Jun. 7, 2013

(86) PCT No.: PCT/EP2013/061848
§ 371 (c)(1),
(2) Date: Dec. 5, 2014

(87) PCT Pub. No.: WO2013/182699
PCT Pub. Date: Dec. 12, 2013

(65) Prior Publication Data
US 2015/0179245 A1 Jun. 25, 2015

(30) Foreign Application Priority Data
Jun. 8, 2012 (EP) ..................................... 12290195

(51) Int. Cl.
*G11C 11/16* (2006.01)
(52) U.S. Cl.
CPC ............ *G11C 11/1675* (2013.01); *G11C 11/16* (2013.01); *G11C 11/161* (2013.01)

(58) Field of Classification Search
CPC ..................... G11C 11/1675; G11C 2013/008; G11C 11/16–11/20
See application file for complete search history.

(56) References Cited

U.S. PATENT DOCUMENTS

| 6,950,335 | B2 * | 9/2005 | Dieny et al. | 365/171 |
|---|---|---|---|---|
| 7,432,574 | B2 * | 10/2008 | Nakamura et al. | 257/421 |
| 7,932,513 | B2 * | 4/2011 | Hosotani | B82Y 10/00 257/295 |
| 8,089,132 | B2 * | 1/2012 | Zheng et al. | 257/421 |

FOREIGN PATENT DOCUMENTS

| EP | 2405439 A1 | 1/2012 |
|---|---|---|
| EP | 2447948 A1 | 5/2012 |

OTHER PUBLICATIONS

Li et al., Thermal-Assisted Spin Transfer Torque Memory (STT-RAM) Cell Design Exploration, May 13-15, 2009, 2009 IEEE Computer Society Annual Symposium on VLSI, pp. 217-222.*
International Search Report for PCT/EP2013/061848 dated Aug. 7, 2013.
Written Opinion for PCT/EP2013/061848 dated Aug. 7, 2013.

* cited by examiner

*Primary Examiner* — Harry W Byrne
*Assistant Examiner* — R Lance Reidlinger
(74) *Attorney, Agent, or Firm* — Pearne & Gordon LLP

(57) ABSTRACT

Method for writing to a MRAM cell including a magnetic tunnel junction including a first and second ferromagnetic layer, and a tunnel barrier layer; and a bipolar transistor in electrical connection with one end of the magnetic tunnel junction, the bipolar transistor being arranged for controlling the passing and polarity of a heating current in the magnetic tunnel junction. The method includes a sequence of writing steps, each writing step including passing the heating current in the magnetic tunnel junction such as to heat it to a high temperature threshold; and once the magnetic tunnel junction has reached the high temperature threshold, adjusting a second magnetization of the second ferromagnetic layer for writing a write data; wherein during one of the writing steps, the polarity of the heating current is reversed from one during the subsequent writing step. The method allows for an increased lifespan of the MRAM cell.

3 Claims, 2 Drawing Sheets

METHOD FOR WRITING TO A RANDOM ACCESS MEMORY (MRAM) CELL WITH IMPROVED MRAM CELL LIFESPAN

FIELD

The present disclosure relates to a method for writing to a random access memory (MRAM) cell. The present disclosure further pertains to a method that allows for an increased lifespan of the MRAM cell.

DESCRIPTION OF RELATED ART

Conventional MRAM-based devices comprise MRAM cells containing a magnetic tunnel junction, formed from a barrier layer disposed between a ferromagnetic reference layer and a storage layer. The MRAM cell further comprises a CMOS transistor, electrically connected to the magnetic tunnel junction, and which opening and closing allows for addressing each MRAM cell in the MRAM device individually.

During a thermally assisted (TAS) write operation, the transistor is set in a passing mode and a heating current is passed in the magnetic tunnel junction via the current line such as to heat the magnetic tunnel junction to a high temperature. A field current can then be passed in the field line such as to generate a magnetic field adapted to switch the magnetization of the storage layer of the heated magnetic tunnel junction. In particular, the heating of the magnetic tunnel junction can be generated by the pulsed heating current passing through the barrier layer that comprises a thin oxide layer. The exposure of the thin oxide layer to repeating the heating current (or voltage) cycling can lead to its degradation and hence limit the endurance of the MRAM cell. Thus limiting the magnitude of the voltage across this oxide is important in extending the endurance of the TAS-MRAM cell.

In patent application EP2405439 by the present applicant, the magnetic tunnel junction of a MRAM cell comprises a thermal insulating layer for lowering heat losses in the magnetic tunnel junction when passing the heating current. In patent application EP2447948 the present applicant further discloses the magnetic tunnel junction comprising a heating element adapted to generate heat when the heating current is passed in the magnetic tunnel junction. A thermal barrier in series with the heating element can confine the heat generated by the heating element within the magnetic tunnel junction. The above solutions allow for passing the heating current with lower magnitude, thus diminishing the ageing effects.

SUMMARY

The present disclosure concerns a method for writing to a MRAM cell comprising a magnetic tunnel junction comprising a first ferromagnetic layer; a second ferromagnetic layer; and a tunnel barrier layer between the first and storage layers; and a transistor in electrical connection with one end of the magnetic tunnel junction; the method comprising a sequence of writing steps, each writing step comprising: passing the heating current in the magnetic tunnel junction such as to heat the magnetic tunnel junction to a high temperature threshold; and once the magnetic tunnel junction has reached the high temperature threshold, adjusting a second magnetization of the second ferromagnetic layer for writing a write data; wherein the transistor is a bipolar transistor being arranged for controlling the passing of a heating current in the magnetic tunnel junction and changing the heating current polarity, and wherein the polarity of the heating current is reversed from one writing step to the subsequent writing step.

An advantage of the method is the increased lifespan of the magnetic tunnel junction of the MRAM cell.

BRIEF DESCRIPTION OF THE DRAWINGS

The disclosure will be better understood with the aid of the description of an embodiment given by way of example and illustrated by the figures, in which.

DETAILED DESCRIPTION OF POSSIBLE EMBODIMENTS

Figure 1:
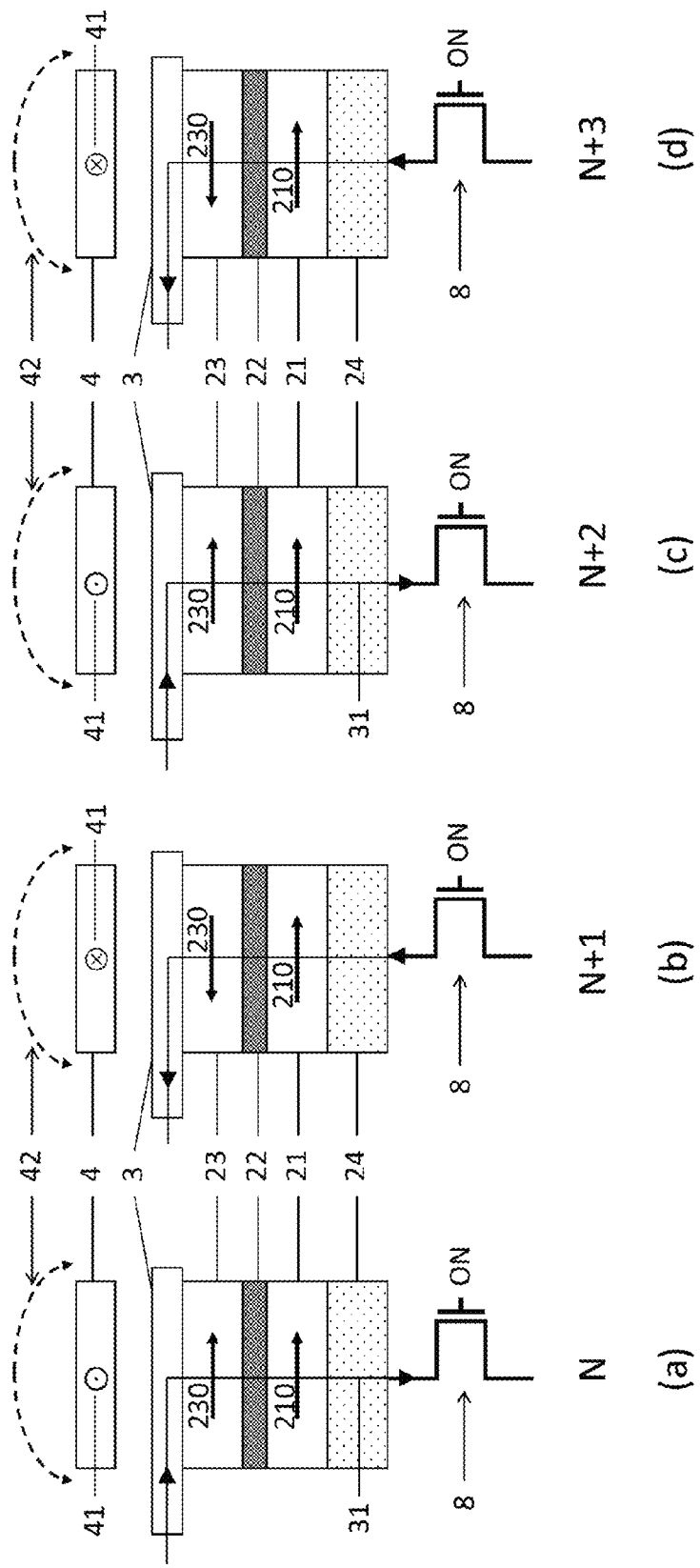
FIGS. 1a to 1d show a MRAM cell and writing steps to writing the MRAM cell, according to an embodiment, and FIG. 2 reports experimental results obtained when performing the method for writing to the MRAM cell.

A thermally-assisted switching MRAM cell 1 according to an embodiment is shown in FIGS. 1a to 1b. The MRAM cell 1 comprises a magnetic tunnel junction 2 comprising a first ferromagnetic layer 21 having a first magnetization 210, a second ferromagnetic layer 23 having a second magnetization 230, and a tunnel barrier layer 22 included between the first and second ferromagnetic layer 21, 23. The MRAM cell 1 further comprises a transistor 8 in electrical connection with one end of the magnetic tunnel junction 2 and arranged for controlling the passing of a heating current 31 in the magnetic tunnel junction 2. Preferably, the transistor 8 is a bipolar transistor such that the polarity of the heating current passing in the tunnel magnetic junction 2 can be reversed. In the example of FIG. 1, the MRAM cell 1 further comprises a current line 3 electrically connected to the magnetic tunnel junction 2 and a field line 4 in communication with the magnetic tunnel junction 2 and substantially perpendicular to the current line 3.

In an embodiment, the second ferromagnetic layer 23 is exchange-coupled with an antiferromagnetic layer 24 adapted to pin the second magnetization 230 at a low temperature threshold and to free it at a high temperature threshold. The antiferromagnetic layer 24 can be made from a manganese-based alloy, such as IrMn, PtMn, NiMn or FeMn, or any other suitable materials. The first magnetization 210 can be fixed, the first ferromagnetic layer 21 acting as a reference layer, or can be freely aligned, the first ferromagnetic layer 21 acting as a sense layer. The tunnel barrier layer 22 is preferably made of a material selected from the group comprising $Al_2O_3$ or MgO.

In a preferred embodiment, the MRAM cell 1 further comprises a field line 4 arranged for passing a field current 41 generating a magnetic field 42 adapted for adjusting the second magnetization 230. In FIG. 1, the field line 4 is located at one end of the magnetic tunnel junction 2, on the side of the second ferromagnetic layer 23. An advantage of this location is the proximity of the field line 4 to the second ferromagnetic layer 23, yielding to high intensity of the magnetic field 42 generated by the field current 41 acting on the second ferromagnetic layer 23. Other arrangements of the field line 4 are however possible. For example, the field line 4 can be located on the other end of the magnetic tunnel junction 2. In that latter configuration, the transistor 8 could be connected to the magnetic tunnel junction 2 via a strap (not shown) such that the field line 4 can be aligned with the magnetic tunnel junction 2.

The MRAM cell 1 can further comprise a current line 3 in electrical contact with the magnetic junction 2 and arranged for providing the heating current in the magnetic tunnel junction 2. In the example of FIG. 1, the current line 3 is connected to the end of the magnetic tunnel junction 2 on the side of the second ferromagnetic layer 23. In FIG. 1, the current line 3 is further arranged orthogonal to the field line 4.

In an embodiment illustrated in FIGS. 1a to 1b, a method for writing to the MRAM cell 1 comprises a sequence of writing steps, wherein each writing step comprises:

passing the heating current 31 in the magnetic tunnel junction 2 such as to heat the magnetic tunnel junction 2 to the high temperature threshold; and once the magnetic tunnel junction 2 has reached the high temperature threshold, adjusting the second magnetization 230 for writing a write data; wherein during the sequence of writing steps, the polarity of the heating current 31 is reversed between each subsequent writing step.

In particular, FIG. 1a illustrates the MRAM cell 1 during a writing step N wherein the heating current 31 is passed in the magnetic tunnel junction 2 in a first polarity from the current line 3 to the transistor 8. FIG. 1b illustrates the MRAM cell 1 during a subsequent writing step N+1 wherein the heating current 31 is passed in the magnetic tunnel junction 2 in a second polarity, opposed to the first polarity, from the transistor 8 to the current line 3. FIG. 1c shows the MRAM cell 1 during another subsequent writing step N+2 with the heating current passing in the magnetic tunnel junction 2 in the first polarity, and FIG. 1d shows the MRAM cell 1 during a yet another subsequent writing step N+3 with the heating current passing in the magnetic tunnel junction 2 in the second polarity. In the method, the polarity of the heating current 31 is reversed from one writing step to the subsequent writing step.

In an embodiment, adjusting the second magnetization 230 comprises passing the field current 41 in the field line 4 such as to generate the magnetic field 42. The writing to the MRAM cell 1 can thus be determined by the magnetic field 42 and be independent of the polarity of the heating current 31.

After each writing step, the method can further comprise cooling the magnetic tunnel junction 2 to a low temperature threshold such as to freeze the second storage magnetization 230 in the written state. Cooling the magnetic tunnel junction 2 can be achieved by blocking the heating current 31 from passing on the magnetic tunnel junction 2, for example, by setting the transistor 8 in a blocking mode.

Figure 2:
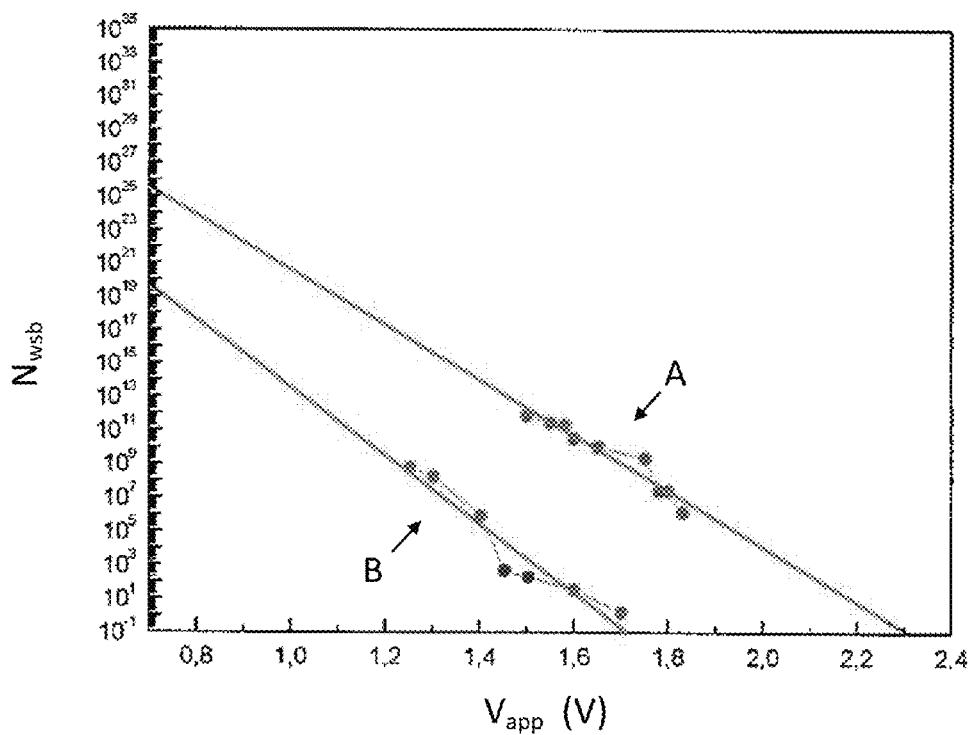

FIG. 2 reports experimental results obtained when performing the method for writing to the MRAM cell, as disclosed herein. More particularly, the writing operation according to the method disclosed herein was performed on a collection of the MRAM cells 1. FIG. 2 plots the number of writing steps performed on the MRAM cells 1 until 63% of the MRAM cell collection experienced a breakdown of their magnetic tunnel junction 2, or number of writing steps to breakdown $N_{wsb}$, as a function of the applied voltage $V_{app}$ (data points A). Here, the applied voltage $V_{app}$ correspond to the voltage difference across the magnetic tunnel junction 2, and is thus proportional to the intensity of the heating current 31. Also reported in FIG. 2 is the number of writing steps to breakdown $N_{wsb}$ as a function of the applied voltage $V_{app}$, in the case the MRAM cells are written with the heating current 31 having the same polarity for all the writing steps (data points B). Data reported in FIG. 2 show that writing to the MRAM cell 1 using the method disclosed herein wherein the polarity of the heating current 31 is reversed between each subsequent writing step can yield to an increase in the number of writing steps to breakdown, and thus the lifespan of the MRAM cell, to about two orders of magnitude.

In an embodiment not represented, a MRAM device comprises a plurality of the MRAM cell 1 and a plurality of the field lines 4 being operatively coupled with the plurality of MRAM cells 1. The plurality of MRAM cells 1 can be arranged in an array of rows and columns. In particular, the MRAM cells 1 can be arranged in a row wherein the field line 4 is operatively coupled with the MRAM cells 1 in the row. Alternatively, the field line 4 can be operatively coupled with the MRAM cells 1 in two adjacent rows. In such a configuration, the magnetic field 42 generated by the field line 4 can switch the second magnetization 230 of the second ferromagnetic layer 23 in the MRAM cells 1 in the two adjacent rows.

REFERENCE NUMBERS AND SYMBOLS 1 magnetic random access memory (MRAM) cell
2 magnetic tunnel junction
21 first ferromagnetic layer
210 first magnetization
22 tunnel barrier layer
23 second ferromagnetic layer
230 second magnetization
24 antiferromagnetic layer
3 current line
31 heating current
4 field line
41 field current
42 magnetic field
8 select transistor
$N_{wsb}$ number of writing steps to breakdown
$V_{app}$ applied voltage

The invention claimed is:

1. A method for writing to a random access memory (MRAM) cell comprising: a magnetic tunnel junction comprising a first ferromagnetic layer having a first magnetization, a second ferromagnetic layer having a second magnetization that can be adjusted at a high temperature threshold, and a tunnel barrier layer between the first ferromagnetic layer and the second ferromagnetic layer; a transistor in electrical connection with one end of the magnetic tunnel junction; and a field line for passing a field current generating a magnetic field; the method comprising:

a first writing step and a second writing step, each writing step comprising:
passing a heating current in the magnetic tunnel junction such as to heat the magnetic tunnel junction to the high temperature threshold; and
once the magnetic tunnel junction has reached the high temperature threshold, passing the field current generating the magnetic field for adjusting the second magnetization for writing a write data;
wherein the transistor is a bipolar transistor arranged for controlling the passing of a heating current in the magnetic tunnel junction and changing the heating current polarity,
the polarity of the heating current in the first writing step is reversed from the polarity of the heating current in the second writing step, and
the second magnetization being adjusted according to the magnetic field, independent of the polarity of the heating current.

2. The method according to claim 1, each writing step further comprising cooling the magnetic tunnel junction to a low temperature threshold such as to freeze the second storage magnetization in the written state.

3. A memory device comprising a plurality of MRAM cells, each MRAM cell comprising a magnetic tunnel junction comprising a first ferromagnetic layer having a first magnetization; a second ferromagnetic layer having a second magnetization that can be adjusted at a high temperature threshold; and a tunnel barrier layer between the first ferromagnetic layer and the second ferromagnetic layer; a bipolar transistor in electrical connection with one end of the magnetic tunnel junction and arranged for controlling the passing of a heating current in the magnetic tunnel junction and its polarity; and a field line for passing a field current generating a magnetic field; wherein:

- the memory device is adapted to write each MRAM cell of the memory device using a first writing step and a second writing step, each writing step comprising:
- passing a heating current in the magnetic tunnel junction such as to heat the magnetic tunnel junction to the high temperature threshold; and
- once the magnetic tunnel junction has reached the high temperature threshold, passing the field current generating the magnetic field for adjusting the second magnetization for writing a write data;
- the bipolar transistor is arranged for controlling the passing of a heating current in the magnetic tunnel junction and changing the heating current polarity,
- the polarity of the heating current in the first writing step is reversed from the polarity of the heating current in the second writing step, and
- the second magnetization being adjusted according to the magnetic field, independent of the polarity of the heating current.

* * * * *